United States Patent
Fujimura

(10) Patent No.: US 8,400,848 B2
(45) Date of Patent: Mar. 19, 2013

(54) BIT LINE NEGATIVE POTENTIAL CIRCUIT AND SEMICONDUCTOR STORAGE DEVICE

(75) Inventor: Yuki Fujimura, Fuchu (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 145 days.

(21) Appl. No.: 13/051,863

(22) Filed: Mar. 18, 2011

(65) Prior Publication Data

US 2012/0075936 A1    Mar. 29, 2012

(30) Foreign Application Priority Data

Sep. 24, 2010  (JP) .................. 2010-213544

(51) Int. Cl.
*G11C 7/00* (2006.01)

(52) U.S. Cl. ............. 365/189.09; 365/149; 365/189.15; 365/189.14

(58) Field of Classification Search ............. 365/189.09, 365/149, 189.14, 189.15
See application file for complete search history.

(56) References Cited

U.S. PATENT DOCUMENTS

| | | | |
|---|---|---|---|
| 6,134,147 A * | 10/2000 | Kaneda | 365/185.25 |
| 6,671,201 B2 | 12/2003 | Masuda | |
| 7,277,322 B2 | 10/2007 | Hirabayashi | |
| 7,366,007 B2 | 4/2008 | Kanehara | |
| 7,551,474 B2 * | 6/2009 | Kim | 365/149 |
| 7,633,809 B2 * | 12/2009 | Kajiyama | 365/185.25 |
| 2010/0232244 A1 | 9/2010 | Hirabayashi | |

FOREIGN PATENT DOCUMENTS

| | | |
|---|---|---|
| JP | 2002-298586 | 10/2002 |
| JP | 2006-004476 A | 1/2006 |
| JP | 2006-323950 A | 11/2006 |

OTHER PUBLICATIONS

Fujimura et al., "A Configurable SRAM with Constant-Negative-Level Write Buffer for Low-Voltage Operation with 0.149 μm² Cell in 32 nm High-k Metal-Gate CMOS," ISSCC Dig. Tech. Papers, pp. 348-349, Feb. 2010.

* cited by examiner

*Primary Examiner* — Son Dinh
(74) *Attorney, Agent, or Firm* — Knobbe, Martens, Olson & Bear LLP

(57) ABSTRACT

According to one embodiment, a bit line negative potential circuit includes a bit line capacitance compensation capacitor which compensates the capacitance of a bit line and a peripheral capacitance compensation capacitor which compensates the peripheral capacitance of the bit line. After the bit line is switched to a low potential, the bit line is driven based on a charging voltage of the bit line capacitance compensation capacitor and the peripheral capacitance compensation capacitor.

20 Claims, 6 Drawing Sheets

BIT LINE NEGATIVE POTENTIAL CIRCUIT AND SEMICONDUCTOR STORAGE DEVICE

CROSS-REFERENCE TO RELATED APPLICATIONS

This application is based upon and claims the benefit of priority from the prior Japanese Patent Application No. 2010-213544, filed on Sep. 24, 2010; the entire contents of which are incorporated herein by reference.

FIELD

Embodiments described herein relate generally to a bit line negative potential circuit and a semiconductor storage device.

BACKGROUND

As a semiconductor device is miniaturized, a characteristic variation of a transistor increases. In a SRAM, since a transistor smaller than a logic circuit is used, the characteristic variation is larger than that of the logic circuit. Especially when a power supply voltage is low, it is difficult to hold the write margin of the SRAM against the characteristic variation.

In order to secure the write margin of the SRAM, there is a method of making a low potential of a bit line become a negative potential at the time of writing. In order to effectively operate the method of making the bit line become a negative potential at the time of writing, the value of the negative potential of the bit line and a timing of switching the bit line to the negative potential are required to be controlled with high accuracy.

If the value of the negative potential of the bit line is significantly increased, a nonselected cell is erroneously written. If the bit line is switched to the negative potential at a significantly early timing, a sufficient negative potential cannot be applied to the bit line. Meanwhile, if the bit line is switched to the negative potential at a significantly late timing, it takes a longer time for writing operation.

DETAILED DESCRIPTION

In general, according to one embodiment, a bit line negative potential circuit of the embodiments is provided with a bit line capacitance compensation capacitor, a peripheral capacitance compensation capacitor, a first charge circuit, a second charge circuit, and a switching circuit. The bit line capacitance compensation capacitor compensates the capacitance of the bit line. The peripheral capacitance compensation capacitor compensates the peripheral capacitance of the bit line. The first charge circuit charges an electrical charge corresponding to the capacitance of the bit line to the bit line capacitance compensation capacitor. The second charge circuit charges an electrical charge corresponding to a predetermined voltage to the peripheral capacitance compensation capacitor. After the bit line is switched to a low potential, the switching circuit drives the bit line based on the charging voltages of the bit line capacitance compensation capacitor and the peripheral capacitance compensation capacitor.

Exemplary embodiments of a semiconductor storage device will be explained below with reference to the accompanying drawings. The present invention is not limited to the following embodiments.

(First Embodiment)

Figure 1:
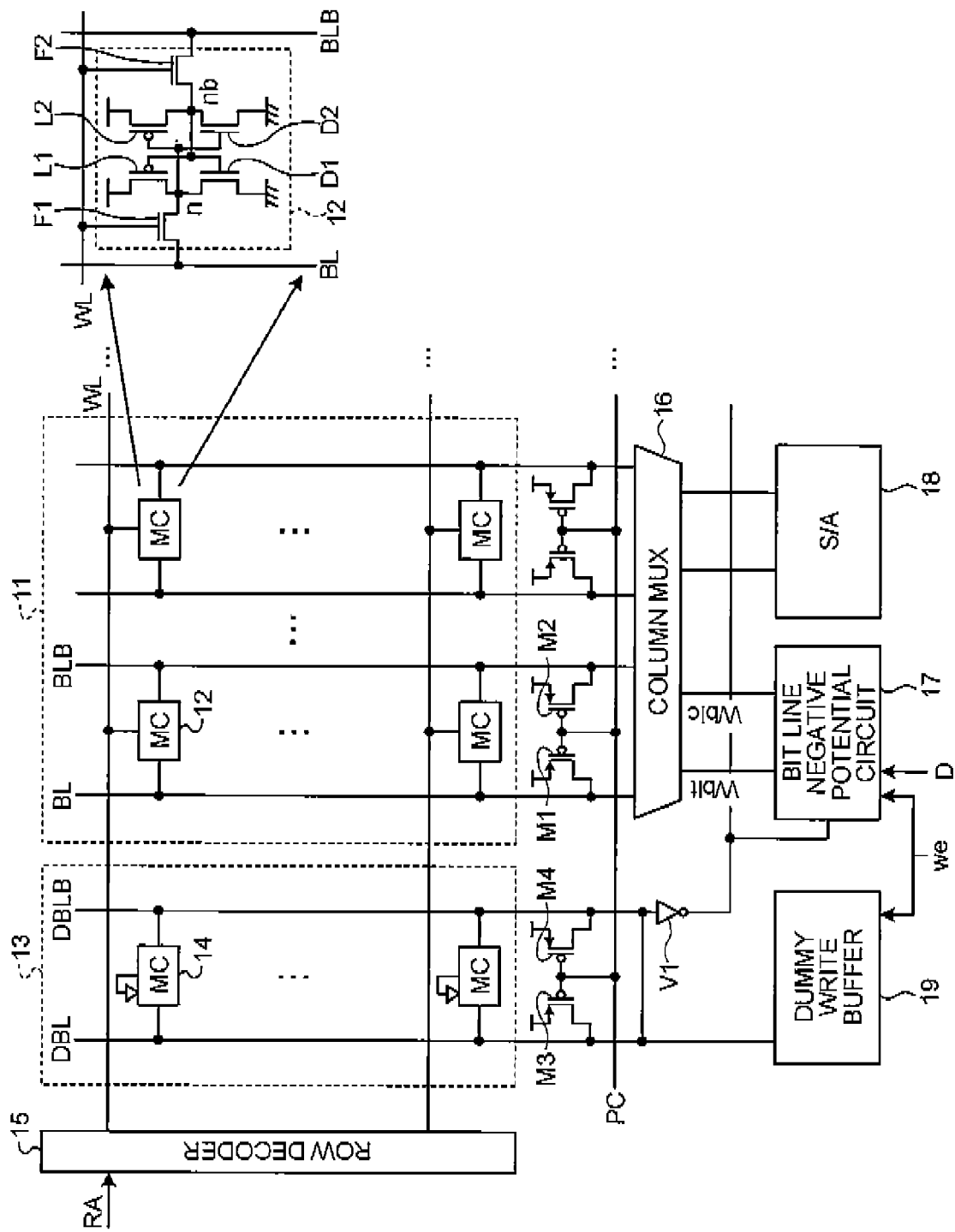
FIG. 1 is a block diagram illustrating a schematic configuration of a semiconductor storage device according to a first embodiment.

FIG. 1 is a block diagram illustrating a schematic configuration of a semiconductor storage device according to a first embodiment.

In FIG. 1, the semiconductor storage device is provided with a memory cell array 11, a dummy cell array 13, a row decoder 15, a column selector 16, a bit line negative potential circuit 17, a sense amplifier 18, and a dummy write buffer 19.

The memory cell array 11 includes memory cells 12 arranged in the form of a matrix in the row and column directions. In the memory cell array 11, a word line WL for performing row selection of the memory cell 12 is provided in each row, and a pair of bit lines BL and BLB for performing column selection of the memory cell 12 is provided in each column.

The memory cell 12 includes a pair of drive transistors D1 and D2, a pair of load transistors L1 and L2, and a pair of transmission transistors F1 and F2. As the load transistors L1 and L2, a P-channel field-effect transistor can be used. As the drive transistors D1 and D2 and the transmission transistors F1 and F2, an N-channel field-effect transistor can be used.

The drive transistor D1 and the load transistor L1 are connected in series to each other, whereby a CMOS inverter is constituted. The drive transistor D2 and the load transistor L2 are connected in series to each other, whereby a CMOS inverter is constituted. The output and input of the pair of CMOS inverters are cross-coupled to each other to thereby constitute a flip-flop. The word line WL is connected to the gates of the transmission transistors F1 and F2.

The bit line BL is connected to the gate of the drive transistor D2, the gate of the load transistor L2, the drain of the drive transistor D1, and the drain of the load transistor L1 through the transmission transistor F1. The bit line BLB is connected to the drain of the drive transistor D2, the drain of the load transistor L2, the gate of the drive transistor D1, and the gate of the load transistor L1 through the transmission transistor F2.

The bit line BL is connected to a power supply potential through a precharge transistor M1, and the bit line BLB is connected to the power supply potential through a precharge transistor M2. The gates of the P-channel field-effect transistor M1 and M2 are connected to each other. The P-channel field-effect transistor can be used as the precharge transistors M1 and M2.

A connecting point between the drain of the drive transistor D1 and the drain of the load transistor L1 constitute a storage node n. A connecting point between the drain of the drive transistor D2 and the drain of the load transistor L2 constitute a storage node nb.

The row decoder 15 can select the word line WL for performing the row selection of the memory cell array 11 based on a row address. The column selector 16 can select the bit lines BL and BLB for performing the column selection of the memory cell array 11. The sense amplifier 18 can sense data, stored in the memory cell 12, based on a signal read on the bit lines BL and BLB from the memory cell 12.

The bit line negative potential circuit 17 can set the low potential of the bit lines BL and BLB as a negative potential at the time of writing in the memory cell 12 and can set the negative potential based on the capacitance of the bit lines BL and BLB and the parasitic capacitance around the bit lines BL and BLB. The bit line negative potential circuit 17 can control the timing of setting the bit lines BL and BLB to the negative potential based on the potentials of dummy bit lines DBL and DBLB at the time of driving the dummy bit lines DBL and DBLB.

The dummy cell array 13 can simulate the capacitance of the bit lines BL and BLB and includes the dummy bit lines DBL and DBLB and a dummy cell 14. The capacitance of the dummy bit lines DBL and DBLB can be coincided with the capacitance of the bit lines BL and BLB. The dummy bit line DBL is connected to the power supply potential through a precharge transistor M3. The dummy bit line DBLB is connected to the power supply potential through a precharge transistor M4. The gates of the P-channel field-effect transistors M3 and M4 are connected to each other. The P-channel field-effect transistor can be used as the precharge transistors M3 and M4.

The dummy cell 14 can be constituted similarly to the memory cell 12. The dummy cell 14 is connected to the dummy bit lines DBL and DBLB and, at the same time, separated from the word line WL.

The dummy write buffer 19 can drive the dummy bit lines DBL and DBLB to a low potential. The timing of driving the dummy bit lines DBL and DBLB to the low potential can be coincided with the timing of driving the bit lines BL and BLB to the low potential. At that time, a write enable signal we is input to the bit line negative potential circuit 17 and the dummy write buffer 19, and, at the same time, write data D is input to the bit line negative potential circuit 17.

When writing is performed in a selection cell, a precharge signal PC falls, whereby the precharge transistors M1 to M4 are turned on, and the bit lines BL and BLB and the dummy bit lines DBL and DBLB are precharged to the power supply potential.

In the row decoder 15, the word line WL is selected based on a row address RA, and the potential of the word line WL of the selected row is raised, whereby the transmission transistors F1 and F2 of the selected row are turned on.

In the bit line negative potential circuit 17, the write data D is input to the bit line negative potential circuit 17, and the write enable signal we rises, whereby one of the bit lines BL and BLB is driven to a low potential according to the write data D.

In the dummy write buffer 19, the write enable signal we rises, whereby the dummy bit lines DBL and DBLD are driven to a low potential at the same timing as driving one of the bit lines BL and BLB to a low potential.

The potential of the dummy bit lines DBL and DBLB is inverted by an inverter V1 and thereafter input to the bit line negative potential circuit 17. Then, in the bit line negative potential circuit 17, when the potential of the dummy bit lines DBL and DBLD is reduced to a predetermined value, one of bit line driving signals wblt and wblc is switched to a negative potential according to the write data D, and one of the bit lines BL and BLB is driven to a negative potential.

In the bit line negative potential circuit 17, the negative potential is set based on the capacitance of the bit lines BL and BLB, whereby even when the capacitance of the bit lines BL and BLB changes, variation of the negative potential of the bit lines BL and BLB can be reduced.

Figure 2:
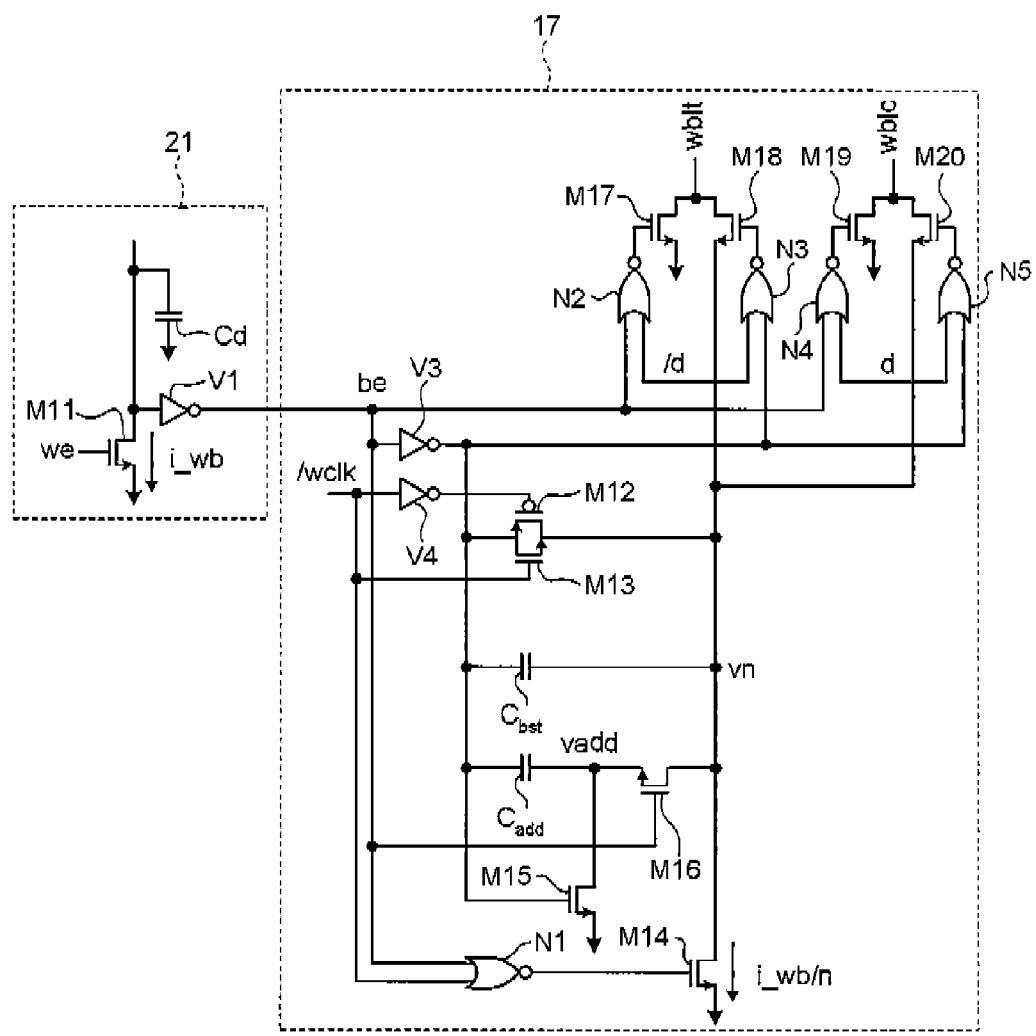
FIG. 2 is a circuit diagram illustrating a schematic configuration of a bit line negative potential circuit applied to the semiconductor storage device of FIG. 1.

FIG. 2 is a circuit diagram illustrating a schematic configuration of the bit line negative potential circuit applied to the semiconductor storage device of FIG. 1.

In FIG. 2, the bit line negative potential circuit 17 includes inverters V3 and V4, NOR circuits N1 to N5, a P-channel field-effect transistor M12, N-channel field-effect transistors M13 to M20, a bit line capacitance compensation capacitor $C_{bst}$, and a peripheral capacitance compensation capacitor $C_{add}$. A capacitance value of the bit line capacitance compensation capacitor $C_{bst}$ can be set based on the capacitance of the bit lines BL and BLB and a value of the negative potential applied to the bit lines BL and BLB. A capacitance value of the peripheral capacitance compensation capacitor $C_{add}$ can be set based on the parasitic capacitance of circuits around the bit lines BL and BLB and a value of the negative potential applied to the bit lines BL and BLB.

Since the power supply voltage is applied to the peripheral capacitance compensation capacitor $C_{add}$ at the time of charging, it has the effect of reducing the total area of the capacitor in comparison with the case where the peripheral capacitance compensation capacitor $C_{add}$ is not used.

The dummy cell array 13 and the dummy write buffer 19 of FIG. 1 are equivalently configured in a monitor circuit 21. The monitor circuit 21 includes an inverter V1, an N-channel field-effect transistor M11, and a dummy capacitance Cd. A value of the dummy capacitance Cd can be set to the capacitance value corresponding to a pair of the bit lines BL and BLB, for example. For example, a threshold value of the inverter V1 can be set to approximately ½ of the power supply voltage.

The drain of the N-channel field-effect transistor M11 is connected to the dummy capacitance Cd and, at the same time, connected to an input terminal of the inverter V1. The source of the N-channel field-effect transistor M11 is grounded.

The drains of the N-channel field-effect transistors M17 and M18 are commonly connected to output the bit line driving signal wblt. The drains of the N-channel field-effect transistors M19 and M20 are commonly connected to output the bit line driving signal wblc.

The sources of the N-channel field-effect transistors M17 and M19 are grounded, and the sources of the N-channel field-effect transistors M18 and M20 are grounded through the N-channel field-effect transistor M14. The drive force of the N-channel field-effect transistor M14 can be set to 1/n (n is a value more than 1) of the drive force of the N-channel field-effect transistor M11. At that time, if a current applied to the N-channel field-effect transistor M11 is i_wb, a current applied to the N-channel field-effect transistor M14 can be set to i_wb/n.

One input terminal of each of the NOR circuits N2 and N4 is connected to an output terminal of the inverter V1. One input terminal of each of the NOR circuits N3 and N5 is connected to the output terminal of the inverter V1 throgh the inverter V3. The other input terminal of each of the NOR circuits N2 and N3 receives an input of a write signal /d. The other input terminal of each of the NOR circuits N4 and N5 receives an input of a write signal d.

The write signal d is a signal in which a negative logical product of the write data D and the write enable signal we is taken. The write signal /d is a signal in which a negative logical product of a reversal value of the write data D and the write enable signal we is taken.

An output terminal of the NOR circuit N2 is connected to the gate of the N-channel field-effect transistor M14. An output terminal of the NOR circuit N3 is connected to the gate of the N-channel field-effect transistor M18. An output terminal of the NOR circuit N4 is connected to the gate of the N-channel field-effect transistor M19. An output terminal of the NOR circuit N5 is connected to the gate of the N-channel field-effect transistor M20.

One input terminal of the NOR circuit N1 is connected to the output terminal of the inverter V1, and the other input terminal of the NOR circuit N1 receives an input of a write control signal /wclk. The output terminal of the NOR circuit N1 is connected to the gate of the N-channel field-effect transistor M14.

The drain of the P-channel field-effect transistor M12 and the drain of the N-channel field-effect transistor M13 are connected to an output terminal of the inverter V3. The source of the P-channel field-effect transistor M12 and the source of the N-channel field-effect transistor M13 are connected to the drain of the N-channel field-effect transistor M14. The gate of the P-channel field-effect transistor M12 receives an input of the write control signal /wclk through the inverter V4. The gate of the N-channel field-effect transistor M13 receives an input of the write control signal /wclk.

The bit line capacitance compensation capacitor $C_{bst}$ is connected to between the output terminal of the inverter V3 and the drain of the N-channel field-effect transistor M14. The peripheral capacitance compensation capacitor $C_{add}$ and the N-channel field-effect transistor M16 are connected in series to each other, and this series circuit is connected in parallel to the bit line capacitance compensation capacitor $C_{bst}$. The gate of the N-channel field-effect transistor M16 is connected to the output terminal of the inverter V1.

The drain of the N-channel field-effect transistor M15 is connected to a connecting point between the peripheral capacitance compensation capacitor $C_{add}$ and the N-channel field-effect transistor M16, and the source of the N-channel field-effect transistor M15 is grounded. The gate of the N-channel field-effect transistor M15 is connected to the output terminal of the inverter V3.

Figure 3:
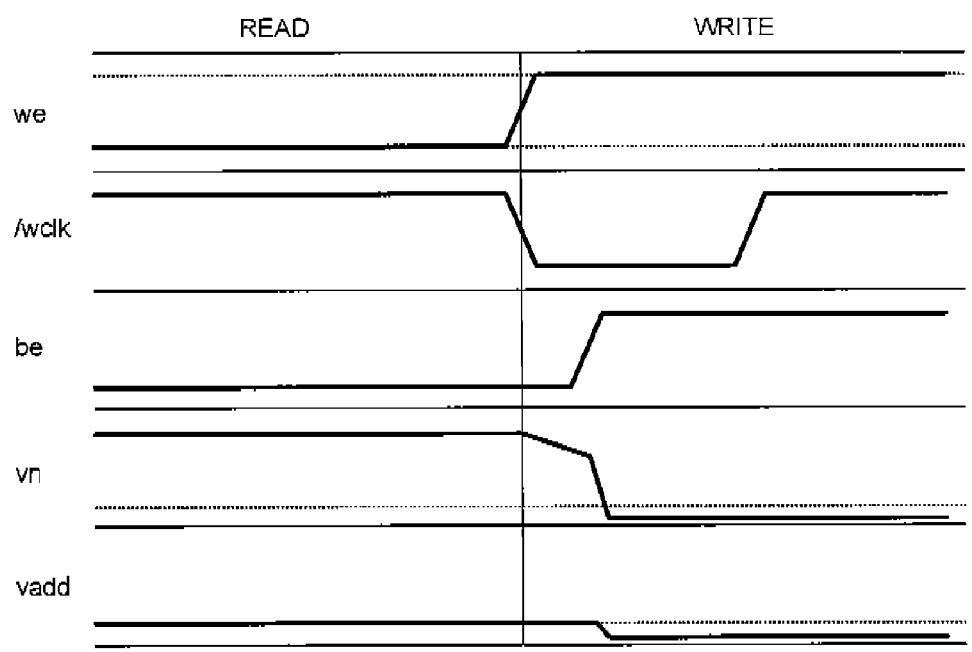
FIG. 3 is a timing chart illustrating a voltage waveform of each part of the bit line negative potential circuit applied to the semiconductor storage device of FIG. 1.

FIG. 3 is a timing chart illustrating a voltage waveform of each part of the bit line negative potential circuit applied to the semiconductor storage device of FIG. 1.

In FIG. 3, the dummy capacity Cd is precharged to the power supply potential before the write enable signal we rises (at the time of reading). When the write enable signal we rises (at the time of writing), the N-channel field-effect transistor M11 is turned on, and discharging of the dummy capacitance Cd is started. The potential of the dummy capacitance Cd is inverted by the inverter V1 to thereby generate a monitor signal be, and the monitor signal be is input to one input terminal of the NOR circuits N1, N2, and N4. The monitor signal be is inverted by the inverter V3 to be input to one input terminal of the NOR circuits N3 and N5 and, at the same time, applied to each end of the bit line capacitance compensation capacitor $C_{bst}$ and the peripheral capacitance compensation capacitor $C_{add}$.

At an initial stage after the write enable signal we rises, the discharging of the dummy capacitance Cd is not as progressed as the monitor signal be is inverted by the inverter V1, and therefore, the monitor signal be maintains low level.

Thus, the outputs of the NOR circuits N2 and N4 become high level, and one of the N-channel field-effect transistors M17 and M19 is turned on according to the values of the write signals d and /d. At the same time, the outputs of the NOR circuits N3 and N5 become low level, and the N-channel field-effect transistors M18 and M20 are turned off.

Consequently, one of the bit line drive signals wblt and wblc becomes a low potential according to the values of the write signals d and /d, and one of the bit lines BL and BLB is driven to the low potential.

At the time of reading, the write control signal /wclk is maintained at high level, and the output of the NOR circuit N1 is low level, so that the N-channel field-effect transistor M14 is turned off.

When the write control signal /wclk is high level, the P-channel field-effect transistor M12 and the N-channel field-effect transistor M13 are turned on, and the both ends of the bit line capacitance compensation capacitor $C_{bst}$ are short-circuited. Since the output of the inverter V3 is high level before the rising of the monitor signal be, an inner potential vn is maintained at the power supply potential when the write control signal/wclk is high level.

When the write enable signal we rises, the write control signal/wclk falls, and the P-channel field-effect transistor M12 and the N-channel field-effect transistor M13 are turned off, so that the both ends of the bit line capacitance compensation capacitor $C_{bst}$ are separated.

After the falling of the write control signal/wclk, the output of the NOR circuit N1 becomes high level before the rising of the monitor signal be, so that the N-channel field-effect transistor M14 is turned on.

When the N-channel field-effect transistor M14 is turned on, the bit line capacitance compensation capacitor $C_{bst}$ is discharged in accordance with the drive force of the N-channel field-effect transistor M14, and an inner potential vn is gradually reduced. The inclination of the reduction of the inner potential vn can be adjusted by adjusting the drive force of the N-channel field-effect transistor M14.

Before the rising of the monitor signal be, the N-channel field-effect transistor M15 is turned on, and, at the same time, the N-channel field-effect transistor M16 is turned off. Thus, an inner potential vadd is maintained at ground potential. At the same time, the power supply voltage is applied to between the both ends of the peripheral capacitance compensation capacitor $C_{add}$, and an electrical charge corresponding to the power supply voltage is accumulated in the peripheral capacitance compensation capacitor $C_{add}$.

When the discharging of the dummy capacitance Cd is progressed, the monitor signal be is inverted by the inverter V1, and the monitor signal be becomes high level. When the monitor signal be becomes high level, the output of the NOR circuit N1 becomes low level, and the N-channel field-effect transistor M14 is turned off.

Thus, the discharging of the bit line capacitance compensation capacitor $C_{bst}$ through the N-channel field-effect transistor M14 is stopped. When the monitor signal be becomes high level, the output of the inverter V3 becomes low level, and one end of the bit line capacitance compensation capacitor $C_{bst}$ is grounded, so that the inner potential vn becomes a negative potential according to the discharge amount of the bit line capacitance compensation capacitor $C_{bst}$.

When the monitor signal be becomes high level, the outputs of the NOR circuits N3 and N5 become high level, and one of the N-channel field-effect transistors M18 and M20 is turned on according to the values of the write signal d and /d. At the same time, the outputs of the NOR circuits N2 and N4 become low level, and the N-channel field-effect transistors M17 and M19 are turned off.

Consequently, one of the bit line drive signals wblt and wblc becomes a negative potential according to the values of the write signals d and /d, and one of the bit lines BL and BLB is driven to a negative potential.

The rising timing of the monitor signal be is specified by the value of the dummy capacitance Cd, and the value of the dummy capacitance Cd is configured so that the capacitance values of the bit lines BL and BLB are simulated. Thus, even when the capacitance of the bit lines BL and BLB changes, the value of the negative potential of the bit lines BL and BLB and the timing of switching the bit lines BL and BLB to a negative potential can be controlled with high accuracy, and the write margin of the SRAM can be enhanced.

When the monitor signal be rises, the N-channel field-effect transistor M15 is turned off, and, at the same time, the N-channel field-effect transistor M16 is turned on. The output of the inverter V3 becomes low level, and one end of the peripheral capacitance compensation capacitor $C_{add}$ is grounded. Consequently, the inner potential vadd becomes negative potential according to an accumulated charge amount of the peripheral capacitance compensation capacitor $C_{add}$, and, at the same time, the inner potential vadd is superimposed on the inner potential vn.

Thus, the capacitance of the bit lines BL and BLB compensated by the bit line capacitance compensation capacitor $C_{bst}$ at the time of writing can be further compensated by the peripheral capacitance compensation capacitor $C_{add}$, so that the variation of the negative potential of the bit lines BL and BLB can be reduced.

Namely, while the charging voltage of the bit line capacitance compensation capacitor $C_{bst}$ is set based on the monitoring result of the discharging of the dummy capacitance Cd, the charging voltage of the peripheral capacitance compensation capacitor $C_{add}$ is set based on the power supply voltage. Thus, for example, even when the compensating effect of the bit line capacitance compensation capacitor $C_{bst}$ is reduced because the length of the bit lines BL and BLB is small, the variation of the negative potential due to the parasitic capacitance around the bit lines BL and BLB can be compensated effectively.

Figure 4:
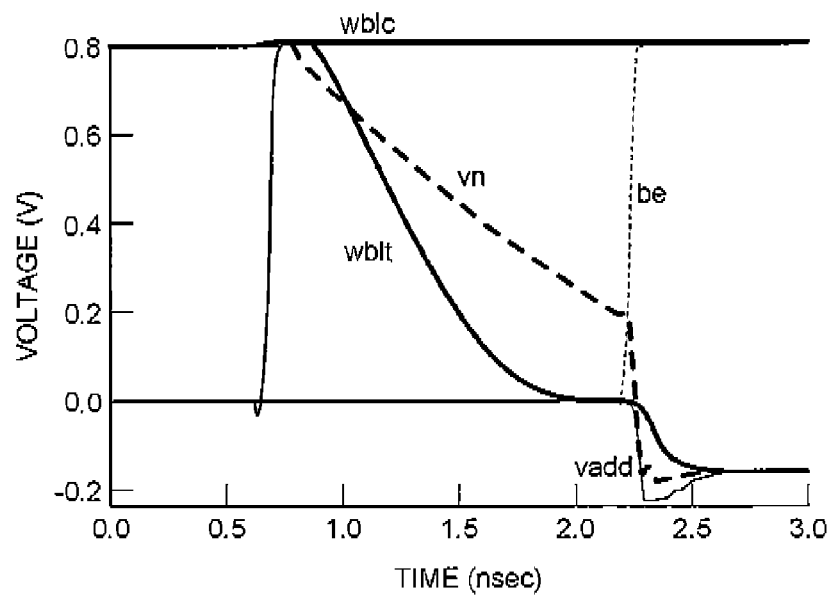
FIG. 4 is a view illustrating the voltage waveform of each part of the bit line negative potential circuit at the time of writing in the semiconductor storage device of FIG. 1.

FIG. 4 is a view illustrating the voltage waveform of each part of the bit line negative potential circuit at the time of writing in the semiconductor storage device of FIG. 1. In the example of FIG. 4, the N-channel field-effect transistors M19 and M20 of FIG. 2 are in the off state, and the N-channel field-effect transistor M18 is turned on after the N-channel field-effect transistor M17 is turned on.

In FIG. 4, before the rising of the monitor signal be, the bit line capacitance compensation capacitor $C_{bst}$ is discharged through the N-channel field-effect transistor M14, and therefore, the inner potential vn is gradually reduced according to the drive force of the N-channel field-effect transistor M14.

Meanwhile, since the power supply voltage is applied to between the both ends of the peripheral capacitance compensation capacitor $C_{add}$, the state that the electrical charge corresponding to the power supply voltage is accumulated in the peripheral capacitance compensation capacitor $C_{add}$ is maintained, and the inner potential vadd is maintained constant.

Then, when the monitor signal be rises, each end of the bit line capacitance compensation capacitor $C_{bst}$ and the peripheral capacitance compensation capacitor $C_{add}$ is grounded. Therefore, the inner potential vn shifts to negative potential according to the electrical charge accumulated in the bit line capacitance compensation capacitor $C_{bst}$ at that time, and, at the same time, the inner potential vadd shifts to negative potential according to the electrical charge accumulated in the peripheral capacitance compensation capacitor $C_{add}$ at that time.

Figure 5:
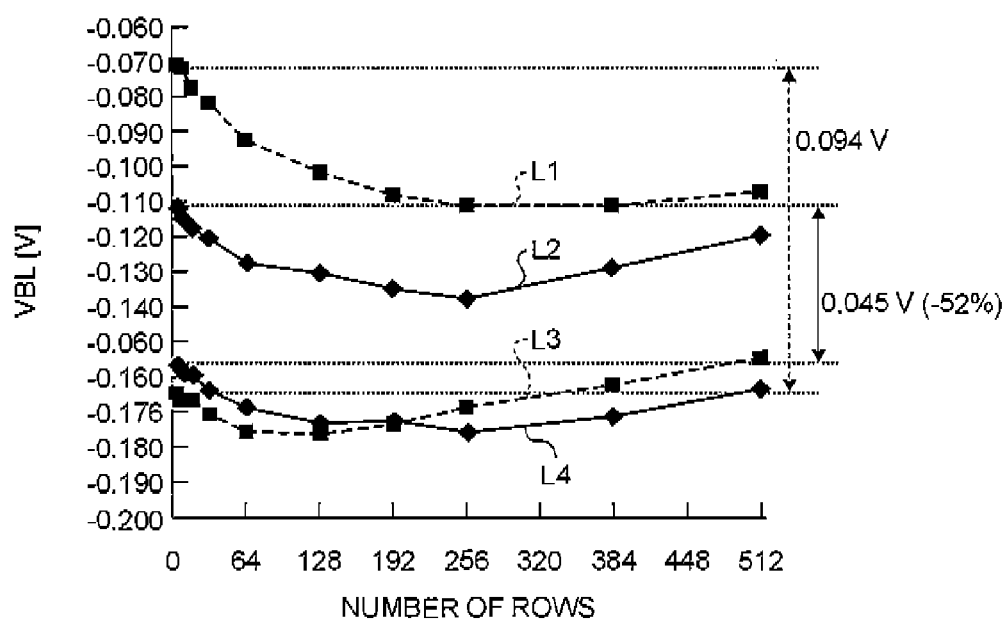
FIG. 5 is a view illustrating a relationship between a bit line voltage generated in the bit line negative potential circuit of FIG. 2 and the number of rows.

FIG. 5 is a view illustrating a relationship between a bit line voltage VBL generated in the bit line negative potential circuit of FIG. 2 and the number of rows. When the number of rows increases, the bit line length increases. L1 and L2 show a case where a threshold value of a transistor is large, and L3 and L4 show a case where the threshold value of the transistor is small. Further, L1 and L3 show a case where there is no peripheral capacitance compensation capacitor $C_{add}$, and L2 and L4 show a case where there is the peripheral capacitance compensation capacitor $C_{add}$.

In FIG. 5, in any of L1 to L4, when the length of the bit lines BL and BLB is small, the compensation effect of the bit line capacitance compensation capacitor $C_{bst}$ is reduced, and an absolute value of the negative potential decreases.

Here, by virtue of adding the peripheral capacitance compensation capacitor $C_{add}$, even when the length of the bit lines BL and BLB is small, the reduction of the compensation effect of the bit line capacitance compensation capacitor $C_{bst}$ can be suppressed, and the variation of the negative potential of the bit lines BL and BLB can be suppressed.

(Second Embodiment)

Figure 6:
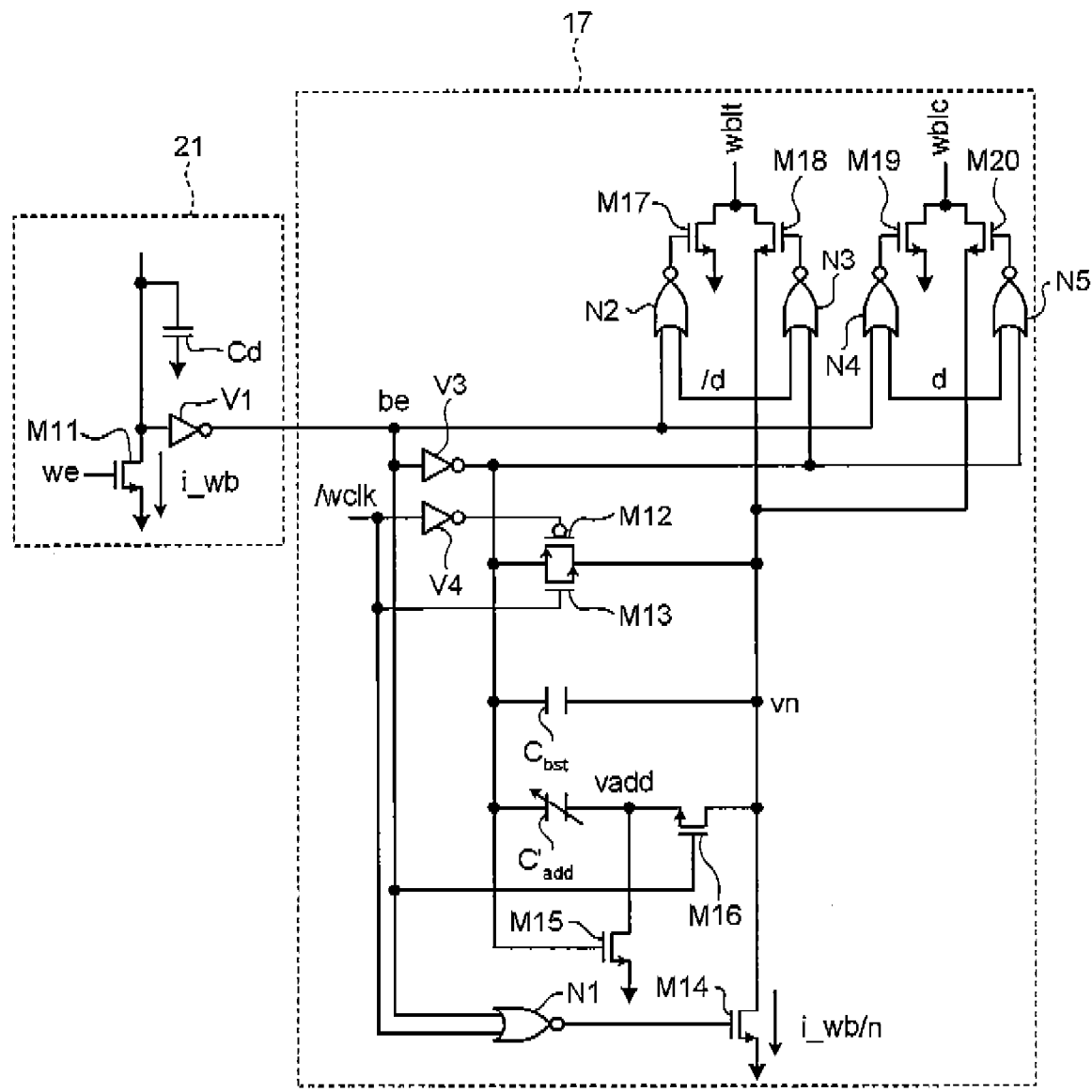
FIG. 6 is a circuit diagram illustrating a schematic configuration of a bit line negative potential circuit applied to a semiconductor storage device according to a second embodiment.

FIG. 6 is a circuit diagram illustrating a schematic configuration of a bit line negative potential circuit applied to a semiconductor storage device according to a second embodiment.

In FIG. 6, the bit line negative potential circuit includes a peripheral capacitance compensation capacitor $C_{add}'$ instead of the peripheral capacitance compensation capacitor $C_{add}$ of FIG. 2. As the peripheral capacitance compensation capacitor $C_{add}'$, a variable-capacitance capacitor can be used.

The capacitance value of the peripheral capacitance compensation capacitor $C_{add}'$ is switched according to process conditions, whereby the variation of the negative potential due to process variation can be suppressed. The capacitance value of the peripheral capacitance compensation capacitor $C_{add}'$ can be set by a fuse in a semiconductor chip, for example. The fuse can be programmed at the time of shipment based on each process information of a lot, a wafer, or a chip.

Alternatively, a process monitor circuit such as a threshold monitor circuit is mounted in the semiconductor chip instead of the fuse, and the capacitance value of the peripheral capacitance compensation capacitor $C_{add}'$ may be set based on the output of the process monitor circuit.

Figure 7:
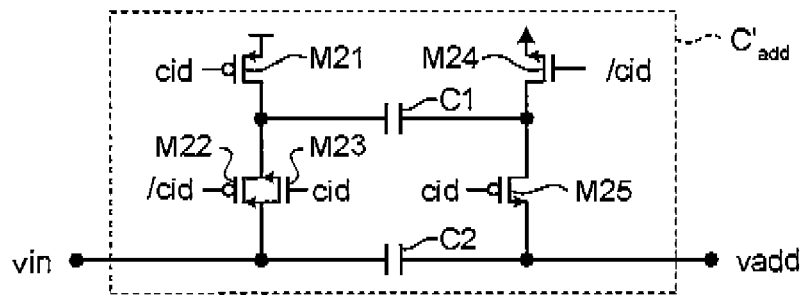
FIG. 7 is a circuit diagram illustrating an example of a variable-capacitance capacitor of FIG. 6.

FIG. 7 is a circuit diagram illustrating an example of the variable-capacitance capacitor of FIG. 6.

In FIG. 7, the peripheral capacitance compensation capacitor $C_{add}'$ includes capacitors C1 and C2, P-channel field-effect transistors M21 and M22, and N-channel field-effect transistors M23 to M25.

The P-channel field-effect transistor M22 and the N-channel field-effect transistor M23 are connected in parallel, whereby a transfer gate is constituted. One end of the capacitor C1 and one end of the capacitor C2 are connected to each other through the transfer gate. The other end of the capacitor C1 and the other end of the capacitor C2 are connected to each other through the N-channel field-effect transistor M25. One end of the capacitor C1 is connected to the power supply potential through the P-channel field-effect transistor M21. The other end of the capacitor C1 is grounded through the P-channel field-effect transistor M24.

The gate of the P-channel field-effect transistor M21 and the gates of the N-channel field-effect transistors M23 and M25 receive an input of a switch signal cid. The gate of the P-channel field-effect transistor M22 and the gate of the N-channel field-effect transistor M24 receive an input of a switch inversion signal /cid. One end of the capacitor C2 is connected to an input potential vin, and the other end of the capacitor C2 is connected to the inner potential vadd.

When the switch signal cid becomes high level, the P-channel field-effect transistor M22 and the N-channel field-effect transistors M23 and M25 are turned on, and the capacitors C1 and C2 are connected in parallel to each other. Further, when the switch signal cid becomes high level, the P-channel field-effect transistor M21 and the N-channel field-effect transistor M24 are turned off, and the input potential vin and the inner potential vadd are separated from the power supply potential and a ground potential.

Meanwhile, when the switch signal cid becomes low level, the P-channel field-effect transistor M22 and the N-channel field-effect transistors M23 and M25 are turned off, and the capacitors C1 and C2 are separated from each other. Further, when the switch signal cid becomes low level, the P-channel field-effect transistor M21 and the N-channel field-effect transistor M24 are turned on, one end and the other end of the capacitor C2 are connected to the power supply potential and the ground potential. Thus, the capacitor C2 can be prevented from being in a floating state, and it is possible to prevent that the potential of the capacitor C2 becomes unstable to cause the occurrence of an unexpected voltage.

(Third Embodiment)

Figure 8:
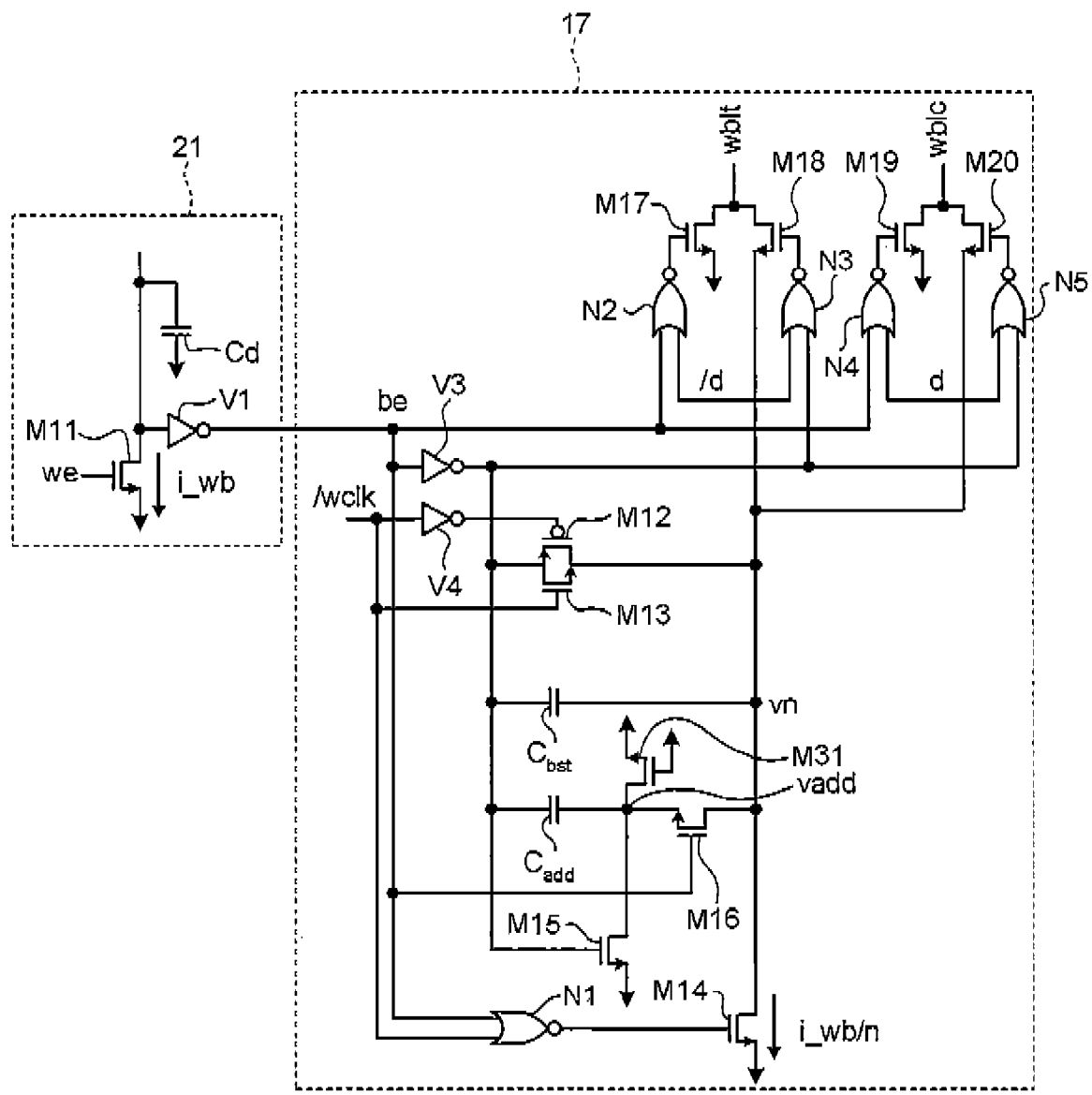
FIG. 8 is a circuit diagram illustrating a schematic configuration of a bit line negative potential circuit applied to a semiconductor storage device according to a third embodiment.

FIG. 8 is a circuit diagram illustrating a schematic configuration of a bit line negative potential circuit applied to a semiconductor storage device according to a third embodiment.

In FIG. 8, the bit line negative potential circuit includes an N-channel field-effect transistor M31 in addition to the configuration of FIG. 2. The drain of the N-channel field-effect transistor M31 is connected to a connecting point between a peripheral capacitance compensation capacitor $C_{add}$ and the N-channel field-effect transistor M31. The gate and the source of the N-channel field-effect transistor M31 are grounded.

The N-channel field-effect transistor M31 can function as a limiter circuit limiting a voltage applied to the peripheral capacitance compensation capacitor $C_{add}$. Namely, when the absolute value of the inner potential vadd is more than a threshold value, the N-channel field-effect transistor M31 is turned on, and the peripheral capacitance compensation capacitor $C_{add}$ is discharged through the N-channel field-effect transistor M31. Therefore, overshooting of the inner potential vadd can be suppressed.

In the example of FIG. 8, although the N-channel field-effect transistor M31 as the limiter circuit is separately provided, the N-channel field-effect transistor M15 may be used as the limiter circuit without adding the N-channel field-effect transistor M31.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A bit line negative potential apparatus, comprising:
   a first capacitor;
   a second capacitor;
   a first charge circuit configured to charge the first capacitor with an electrical charge corresponding to a capacitance of a bit line;
   a second charge circuit configured to charge the second capacitor with an electrical charge corresponding to a first voltage; and
   a switching circuit configured to drive the bit line based on a charging voltage of the first and second capacitors after the bit line is switched to a low potential.

2. The apparatus of claim 1, wherein:
   the first capacitor comprises a bit line capacitance compensation capacitor configured to compensate the capacitance of the bit line, and
   the second capacitor comprises a peripheral capacitance compensation capacitor configured to compensate a peripheral capacitance of the bit line.

3. The apparatus of claim 1, wherein the first voltage comprises a power supply voltage.

4. The apparatus of claim 1, wherein the switching circuit comprises:
   a first field-effect transistor configured to switch the bit line to a low potential when a discharge amount of a dummy capacitance approximating the capacitance of the bit line is not more than a first value; and
   a second field-effect transistor configured to drive the bit line based on the charging voltage of the first and second capacitors when the discharge amount of the dummy capacitance is more than the first value.

5. The apparatus of claim 4, further comprising a third field-effect transistor configured to discharge the first capacitor when the discharge amount of the dummy capacitance is not more than the first value.

6. The apparatus of claim 5, comprising:
   a fourth field-effect transistor configured to ground one end of the second capacitor when the discharge amount of the dummy capacitance is not more than the first value; and
   a fifth field-effect transistor connected in series to an output terminal side of the second capacitor and configured to separate the second capacitor from the bit line when the discharge amount of the dummy capacitance is not more than the first value.

7. The apparatus of claim 6, wherein a series circuit of the second capacitor and the fifth field-effect transistor is connected in parallel to the first capacitor.

8. The apparatus of claim 1, wherein the second capacitor comprises a variable-capacitance capacitor.

9. The apparatus of claim 8, wherein the switching circuit is further configured to switch the capacitance value of the second capacitor according to process conditions.

10. The apparatus of claim 6, further comprising a voltage limiter configured to limit a voltage applied to the second capacitor.

11. The apparatus of claim 10, wherein the voltage limiter comprises:
- a sixth field-effect transistor comprising a drain electrically coupled to a connecting point between the second capacitor and the fifth field-effect transistor;
- a grounded source; and
- a grounded gate.

12. The apparatus of claim 1, wherein when a discharge amount of a dummy capacitance approximating the capacitance of the bit line is not more than a first value, the bit line is switched to a low potential, the first capacitor is discharged from the power supply voltage, and the power supply voltage is applied to the second capacitor, and when the discharge amount of the dummy capacitance is more than the first value, the bit line is driven based on the charging voltage of the first and second capacitors.

13. A semiconductor storage device, comprising:
- a memory cell array comprising memory cells arranged in a matrix in row and column directions;
- a word line configured to select a row of the memory cell array;
- a row decoder configured to select the word line based on a row address;
- a bit line configured to select a column of the memory cell array;
- a column selector configured to select the bit line;
- a sense amplifier configured to sense data stored in the memory cell, based on a signal read on the bit line from the memory cell; and
- a bit line negative potential apparatus configured to set a low potential of the bit line to a negative potential at the time of writing in the memory cell and to set the negative potential based on a capacitance of the bit line and a parasitic capacitance around the bit line.

14. The semiconductor storage device of claim 13, wherein the bit line negative potential apparatus comprises:
- a first capacitor;
- a second capacitor;
- a first charge circuit configured to charge the first capacitor with an electrical charge corresponding to a capacitance of a bit line;
- a second charge circuit configured to charge the second capacitor with an electrical charge corresponding to a first voltage; and
- a switching circuit configured to drive the bit line based on a charging voltage of the first and second capacitors after the bit line is switched to a low potential.

15. The semiconductor storage device of claim 14, further comprising:
- a dummy bit line configured to approximate the capacitance of the bit line; and
- a dummy write buffer configured to drive the dummy bit line to a low potential,
- wherein the bit line negative potential apparatus is configured to control the timing of setting the bit line to negative potential based on a potential of the dummy bit line at the time of driving the dummy bit line.

16. The semiconductor storage device of claim 15, wherein when the discharge amount of the dummy bit line is not more than a first value, the bit line is switched to a low potential, the first capacitor is discharged from a power supply voltage, and the power supply voltage is applied to the second capacitor, and when the discharge amount of the dummy bit line is more than the first value, the bit line is driven based on the charging voltage of the first and second capacitors.

17. The semiconductor storage device of claim 16, wherein the switching circuit comprises:
- a first field-effect transistor configured to switch the bit line to a low potential when a discharge amount of a dummy bit line is not more than a first value; and
- a second field-effect transistor configured to drive the bit line based on the charging voltage of the first and second capacitors when the discharge amount of the dummy bit line is more than the first value.

18. The semiconductor storage device of claim 17, further comprising a third field-effect transistor configured to discharge the first capacitor when the discharge amount of the dummy bit line is not more than the first value.

19. The semiconductor storage device of claim 18, comprising:
- a fourth field-effect transistor configured to ground one end of the second capacitor when the discharge amount of the dummy bit line is not more than the first value; and
- a fifth field-effect transistor connected in series to the an output terminal side of the second capacitor and configured to separate the second capacitor from the bit line when the discharge amount of the dummy bit line is not more than the first value.

20. The semiconductor storage device of claim 19, wherein a series circuit of the second capacitor and the fifth field-effect transistor is connected in parallel to the first capacitor.

* * * * *